US011480285B2

(12) United States Patent
Lee (10) Patent No.: US 11,480,285 B2
(45) Date of Patent: Oct. 25, 2022

(54) TRIPLE PIPE HEATING DEVICE OF EASY INSTALLATION FOR HEATING EXHAUST GAS IN SEMICONDUCTOR AND LCD MANUFACTURING PROCESS

(71) Applicant: J-SOLUTION CO., LTD., Yongin-si (KR)

(72) Inventor: Seungyong Lee, Hwaseong-si (KR)

(73) Assignee: J-SOLUTION CO., LTD., Yongin-si (KR)

( * ) Notice: Subject to any disclaimer, the term of this patent is extended or adjusted under 35 U.S.C. 154(b) by 539 days.

(21) Appl. No.: 16/607,023

(22) PCT Filed: Mar. 27, 2018

(86) PCT No.: PCT/KR2018/003617
§ 371 (c)(1),
(2) Date: Oct. 21, 2019

(87) PCT Pub. No.: WO2019/004566
PCT Pub. Date: Jan. 3, 2019

(65) Prior Publication Data
US 2020/0049297 A1    Feb. 13, 2020

(30) Foreign Application Priority Data
Jun. 27, 2017    (KR) ........................ 10-2017-0081339

(51) Int. Cl.
*F16L 53/30*    (2018.01)
*F16L 53/38*    (2018.01)
*F16L 9/18*     (2006.01)
*H01L 21/67*    (2006.01)

(52) U.S. Cl.
CPC ................. *F16L 53/38* (2018.01); *F16L 9/18* (2013.01); *H01L 21/67017* (2013.01)

(58) Field of Classification Search
CPC ... F16L 53/38; F16L 9/18; F16L 53/30; F24H 3/08; H01L 21/67017; H01L 21/02; H01L 21/234
USPC ......... 138/121, 122, 148, 149, 109; 219/535
See application file for complete search history.

(56) References Cited

U.S. PATENT DOCUMENTS

| | | | | |
|---|---|---|---|---|
| 4,214,147 A * | 7/1980 | Kraver | .................. | F28F 19/006 219/535 |
| 5,829,483 A * | 11/1998 | Tukahara | .................. | F16L 9/18 138/121 |
| 6,840,284 B2 * | 1/2005 | Schippl | ................. | F16L 59/141 62/50.7 |
| 8,844,579 B2 * | 9/2014 | Eguchi | .................. | F16L 27/111 138/121 |

FOREIGN PATENT DOCUMENTS

| | | |
|---|---|---|
| JP | 2008-311346 A | 12/2008 |
| KR | 10-1075170 B1 | 10/2011 |

(Continued)

*Primary Examiner* — Patrick F Brinson
(74) *Attorney, Agent, or Firm* — Goldilocks Zone IP Law (57) ABSTRACT

The present invention relates to a triple pipe heating device for heating an exhaust gas in a semiconductor and LCD manufacturing process, which has a triple pipe structure capable of effectively heating an exhaust gas with only a small amount of heat without using nitrogen gas, is expandable and bendable so as to be easily installed, and is capable of quickly detecting exhaust gas leakage and overheating.

5 Claims, 7 Drawing Sheets

(56) References Cited

FOREIGN PATENT DOCUMENTS

| KR | 10-2012-0102393 A | 9/2012 |
| KR | 10-2013-0118455 A | 10/2013 |
| KR | 10-1530612 B1 | 6/2015 |
| KR | 10-1562643 B1 | 10/2015 |

* cited by examiner

TRIPLE PIPE HEATING DEVICE OF EASY INSTALLATION FOR HEATING EXHAUST GAS IN SEMICONDUCTOR AND LCD MANUFACTURING PROCESS

CROSS-REFERENCE TO RELATED APPLICATIONS

This application claims the benefit under 35 U.S.C. section 371, of PCT International Application No.: PCT/KR2018/003617, filed on Mar. 27, 2018, which claims foreign priority to Korean Patent Application No.: KR 10-2017-0081339, filed on Jun. 27, 2017, in the Korean Intellectual Property Office, both of which are hereby incorporated by reference in their entireties.

TECHNICAL FIELD

The present disclosure relates to a semiconductor and LCD manufacturing equipment, and in particular, to a triple pipe heating device for heating an exhaust gas in a semiconductor and LCD manufacturing process, which has a triple pipe structure capable of effectively heating an exhaust gas with only a small amount of heat without using nitrogen gas, is expandable and bendable so as to be easily installed, and is capable of quickly detecting exhaust gas leakage and overheating.

BACKGROUND ART

In general, the semiconductor manufacturing process largely includes a pre-process (fabrication process) and a post-process (assembly process), in which the pre-process is a semiconductor chip manufacturing process which repeatedly performs a process of depositing a thin film on a wafer in various process chambers and selectively etching the deposited thin film to form a specific pattern, and the post-process is a process of separately dividing the chips manufactured in the pre-process, and then combining the same with the lead frame to assemble a finished product.

At this time, the process of depositing a thin film on the wafer or etching the thin film deposited on the wafer is performed at a high temperature using a process gas such as hydrogen and harmful gases such as silane, arsine and boron chloride in a process chamber, and during the process, a large amount of exhaust gas containing various flammable gases, corrosive foreign substances, and toxic components is generated in the process chamber.

Accordingly, in the semiconductor manufacturing process, a scrubber that cleans the exhaust gas discharged from the process chamber and emits it to the atmosphere is provided at the rear side of the vacuum pump that makes the process chamber vacuum. However, in the process that the toxic gases generated from the process chamber are moved from the process chamber to the vacuum pump and the scrubber through the pipes, these gases are easily solidified and accumulated, which often leads to clogging.

Therefore, as a way to solve the problem of clogging caused by the solidification of the exhaust gas, a device such as the one described in "Nitrogen Gas Ejector Apparatus With Mix-inducing Body" of Korean Patent Laid-Open No. 2010-0102393, laid-open on Sep. 18, 2012 has been recently proposed, in which the device is configured to prevent solidification of the exhaust gas by injecting high-temperature nitrogen gas into the pipe where the reaction byproduct flows, to mix with the exhaust gas.

However, while the related device as the one described above has been very useful to prevent the solidification of the exhaust gas, it is required that separate facility be provided for generating high temperature nitrogen and installation thereof is also not easy. In addition, there is a risk of leakage of the exhaust gas at the connection parts with the existing transport pipes, but the countermeasures are insufficient.

DETAILED DESCRIPTION OF INVENTION

Technical Problem

Accordingly, the present disclosure has been proposed to solve the problems described above, and it is an object of the present disclosure to provide a triple pipe heating device for heating an exhaust gas in a semiconductor and LCD manufacturing process, which has a triple pipe structure capable of effectively heating an exhaust gas with only a small amount of heat without using nitrogen gas, is expandable and bendable so as to be easily installed, and is capable of quickly detecting exhaust gas leakage and overheating.

Technical Solution

In order to achieve the object described above, a triple pipe heating device for heating an exhaust gas according to the technical idea of the present disclosure is provided, in which the triple pipe heating device is a heating device that prevents solidification of the exhaust gas by heating the exhaust gas conveyed between a vacuum pump and a scrubber in semiconductor and LCD manufacturing process, and the triple pipe heating device may include: a connection pipe connected between the vacuum pump and the scrubber to circulate the exhaust gas to inside, and configured of a plurality of short pipes having an annular shape continuously connected to each other to allow a body of the connection pipe to be expandable and bendable except for both end portions thereof; an inner bellows pipe provided to closely surround an outer circumferential surface of the connection pipe except for both ends of the connection pipe, and expandable and bendable in conjunction with the connection pipe; a heating member provided in close contact with an outer circumferential surface of the inner bellows pipe so as to heat the connection pipe through the inner bellows pipe; and an outer bellows pipe provided to surround the inner bellows pipe while being spaced apart from the inner bellows pipe to define a space so as to block outside air and create a warm atmosphere, and expandable and bendable in accordance with the connection pipe and the inner bellows pipe.

In an embodiment, the heating member may have a predetermined width and formed in a long, flat strip shape to be spirally wound around the outer circumferential surface of the inner bellows pipe, with side ends of the heating member being spaced apart and not overlapped with each other so as not to interfere with each other during expansion and bending of the inner bellows pipe.

In addition, the heating member may include: a heating wire that receives electricity and generates heat; a lower layer portion that is formed by molding and contains the heating wire therein, with a lower surface of the lower layer portion being in contact with the inner bellows pipe, and is formed of a mixture of a polypropylene resin and fine carbon particles in an amount of 20 to 30 wt % relative to the polypropylene resin so as to smoothly emit heat generated from the heating wire; an upper layer portion that is formed by molding in an inverted U-shape to surround upper and side surfaces of the lower layer portion, and is formed of a mixture of a polypropylene resin and fine aluminum hydroxide particles in an amount of 50 to 60 wt % relative to the polypropylene resin so as to block heat generated from the heating wire from being emitted to regions other than a lower surface of the lower layer portion; and an intermediate layer portion that is formed of fine fumed silica particles at an intermediate interface between the lower layer portion and the upper layer portion so as to, in addition to the upper layer, secondly block the heat generated from the heating wire from being emitted to regions other than the lower surface of the lower layer portion, whereby the heat generated from the heating wire is guided toward the connection pipe through the inner bellows pipe.

In addition, a first plug member and a second plug member may be further provided to surround, while being spaced apart from, an outer circumferential surface of a front end of the connection pipe and an outer circumferential surface of a rear end of the connection pipe, which are not surrounded by the inner bellows pipe, so as to sealingly close the front and rear ends of the outer bellows pipe that are open, and a first temperature sensor may be provided inside the first plug member that seals the front end of the outer bellows pipe, to measure a temperature of a sealed inner space of the outer bellows pipe, and a controller may control the heating wire based on the temperature measured by the first temperature sensor to maintain a proper temperature.

In addition, a short connection pipe may be further provided, which may be passed through the first plug member to be connected to the front end of the connection pipe, and sealing boxes and a second temperature sensor may be further provided, in which the sealing boxes may sealingly surround a connection portion between a front end of the short connection pipe and a scrubber-side pipe, and a connection portion between a rear end of the connection pipe and a vacuum pump-side pipe, respectively, while defining therein small-scale spaces for measuring temperature, in which the sealing box may be formed as half bodies are coupled from left and right sides, and the second temperature sensor may measure temperature of the inner space of each sealing box, such that the controller may determine abnormality of the heating wire and exhaust gas leakage based on the temperature of the inner spaces of the sealing boxes measured by the second temperature sensor.

In addition, a gas leak port may be provided on the sealing boxes and the first plug member, which are provided at the connection portion of the front end of the short connection pipe and at the connection portion of the rear end of the connection pipe, respectively, to guide exhaust gas leak to the scrubber, and the rear end of the connection pipe and the vacuum pump-side pipe, and the front end of the short connection pipe and the scrubber-side pipe may be flange-coupled, respectively, and each flange-coupling may be achieved with a ring-shaped clamp, and the front end of the outer bellows pipe and the first plug member, and the rear end of the outer bellows pipe and the second plug member may be flange-coupled, respectively, and each flange-coupling may be achieved with a plurality of claw clamps.

Advantageous Effects

The triple pipe heating device for heating an exhaust gas according to the present disclosure has the advantage that it has a triple pipe structure capable of effectively heating an exhaust gas with only a small amount of heat without using nitrogen gas, while also being expandable and bendable so as to be easily installed.

In addition, according to the present disclosure, the exhaust gas leakage and overheating can more quickly detected by the sealing boxes.

110: connection pipe
120: inner bellows pipe
130: outer bellows pipe
140: heating member
150: sensor module
160: plug module

BEST MODE

A triple pipe heating device for heating an exhaust gas according to embodiments of the present disclosure will be described in detail with reference to the accompanying drawings. Various modifications may be made to exemplary embodiments of the present disclosure, and certain exemplary embodiments will be described below in detail with reference to attached drawings. It should be understood, however, that the disclosure is not to be limited to the specific embodiments, but includes all modifications, equivalents, and alternatives falling within the spirit and scope of the disclosure. The like reference numerals are used for similar elements in describing each of the drawings. In the accompanying drawings, the dimensions of the structure is shown to be larger than the actual size for clarity of the invention, or to be smaller than the actual size to help understand the schematic configuration.

Further, the expressions, "first," "second," and so on may be used in describing a variety of elements, but without limiting these elements to those expressions. The expressions are used only for the purpose of distinguishing one element from another. For example, without departing from the scope of the present disclosure, a first component may be referred to as a second component, and similarly, the second component may also be referred to as the first component. Meanwhile, unless defined otherwise, all expressions used herein, including technical or scientific expressions, have the same meaning as commonly understood by one of ordinary skill in the art to which this disclosure belongs. Expressions such as those defined in commonly used dictionaries should be interpreted as having a meaning consistent with the meaning in the context of the relevant art and are to be interpreted as ideal or overly formal in meaning unless explicitly defined in the present application.

Figure 1:
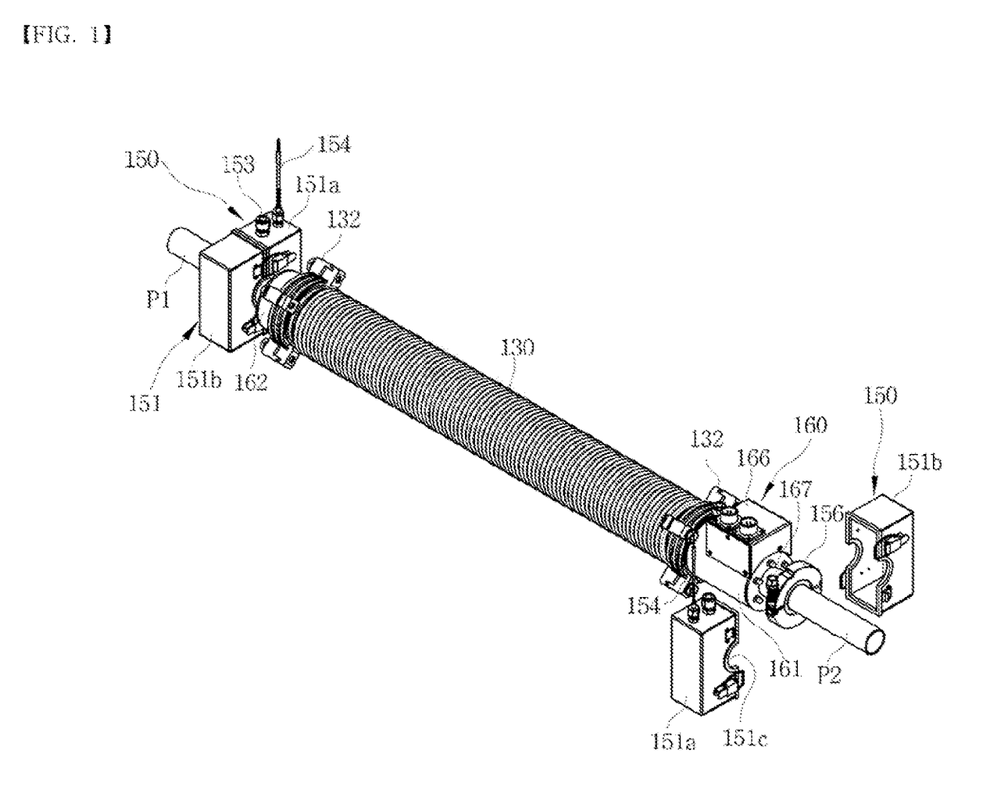
FIG. 1 is a perspective view showing a triple pipe heating device for heating an exhaust gas according to an embodiment of the present disclosure.
Figure 2:
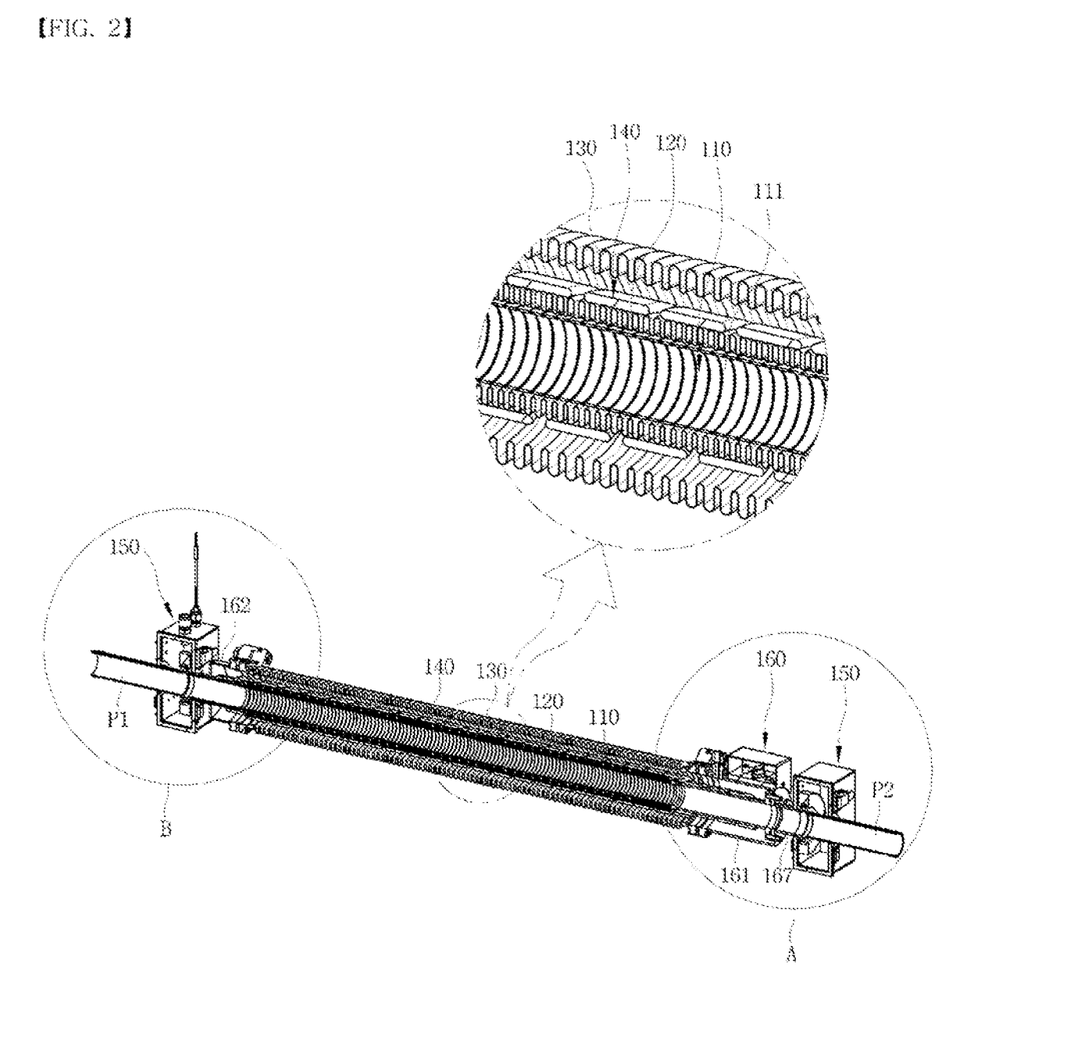
FIG. 2 is a cross-sectional view showing a triple pipe heating device for heating an exhaust gas according to an embodiment of the present disclosure.
Figure 3:
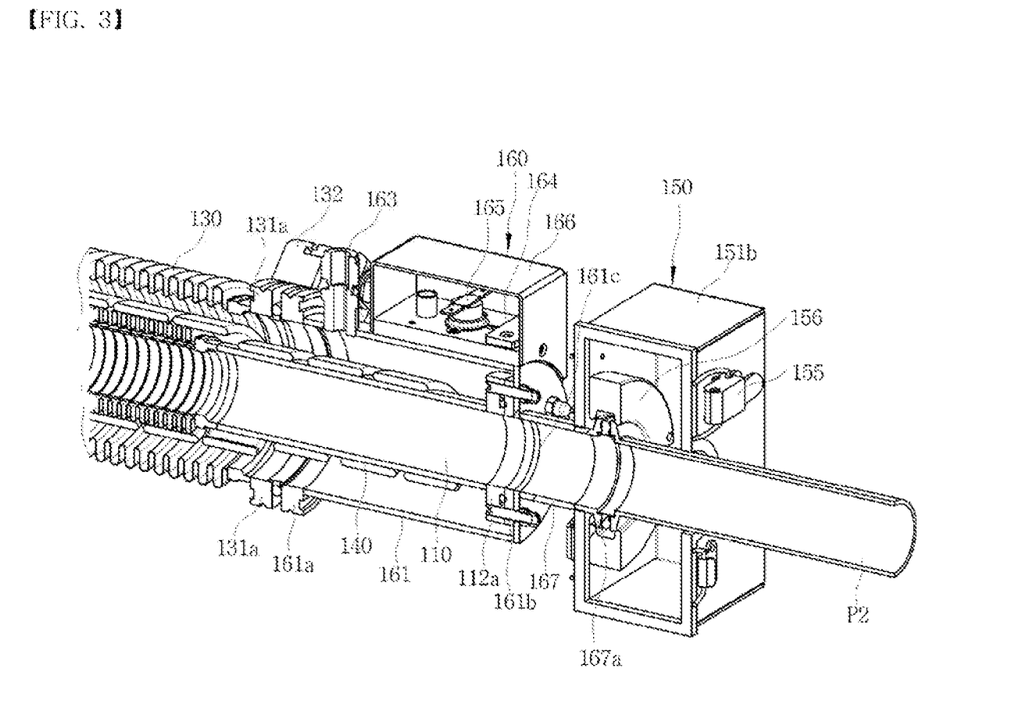
FIG. 3 is an enlarged view of an encircled portion A of FIG. 2.
Figure 4:
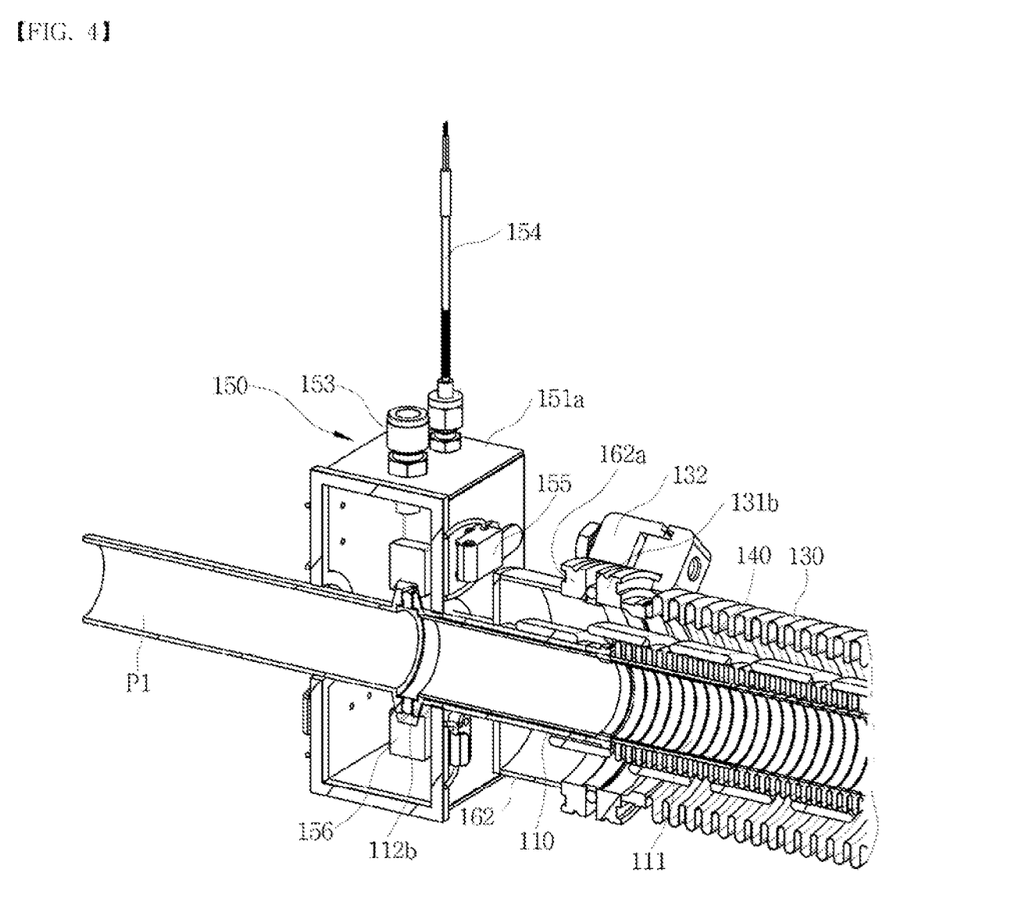
FIG. 4 is an enlarged view of an encircled portion B of FIG. 2.
Figure 5:
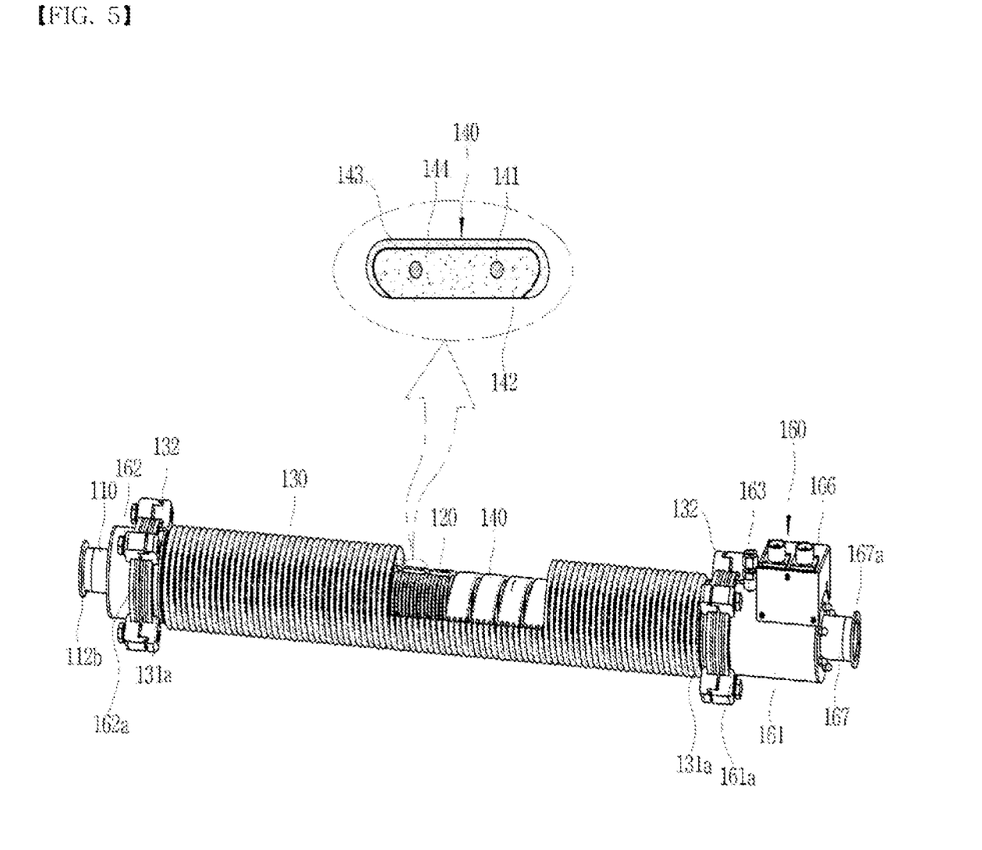
FIG. 5 is a partial cutaway view showing a triple pipe heating device for heating an exhaust gas according to an embodiment of the present disclosure.
Figure 6:
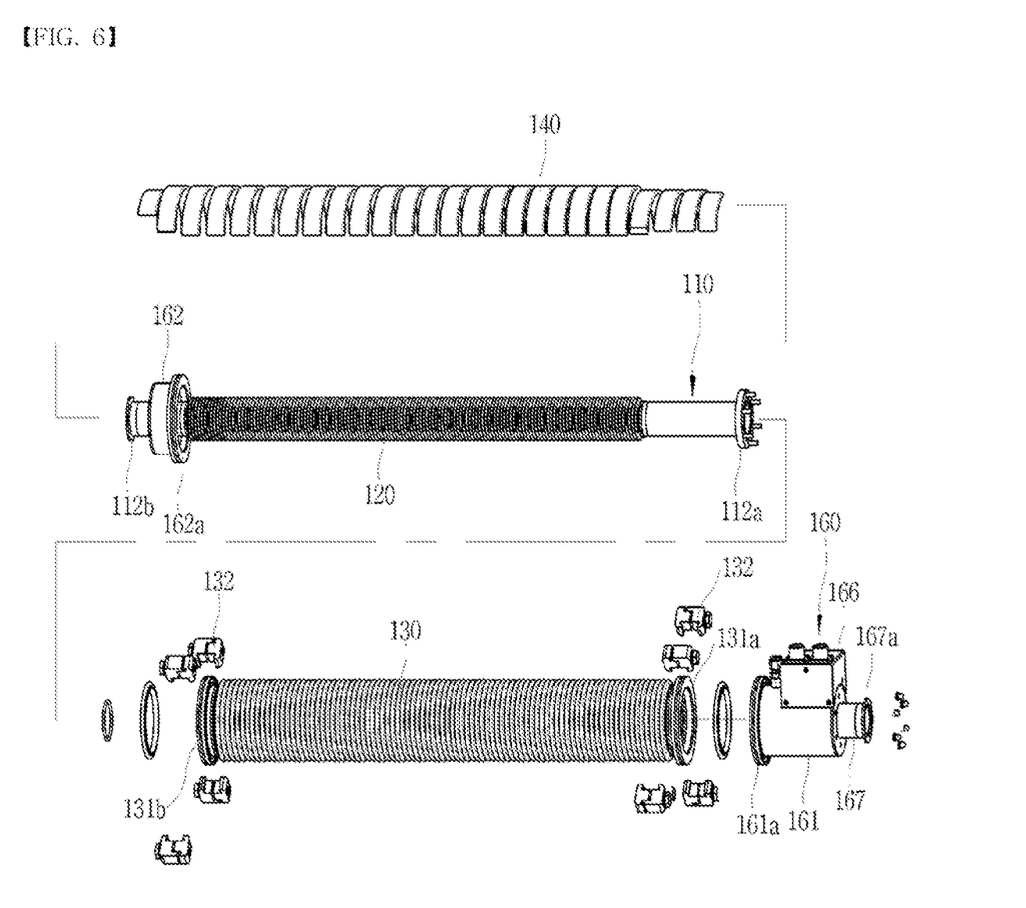
FIG. 6 is an exploded perspective view showing a triple pipe heating device for heating an exhaust gas according to an embodiment of the present disclosure.
Figure 7:
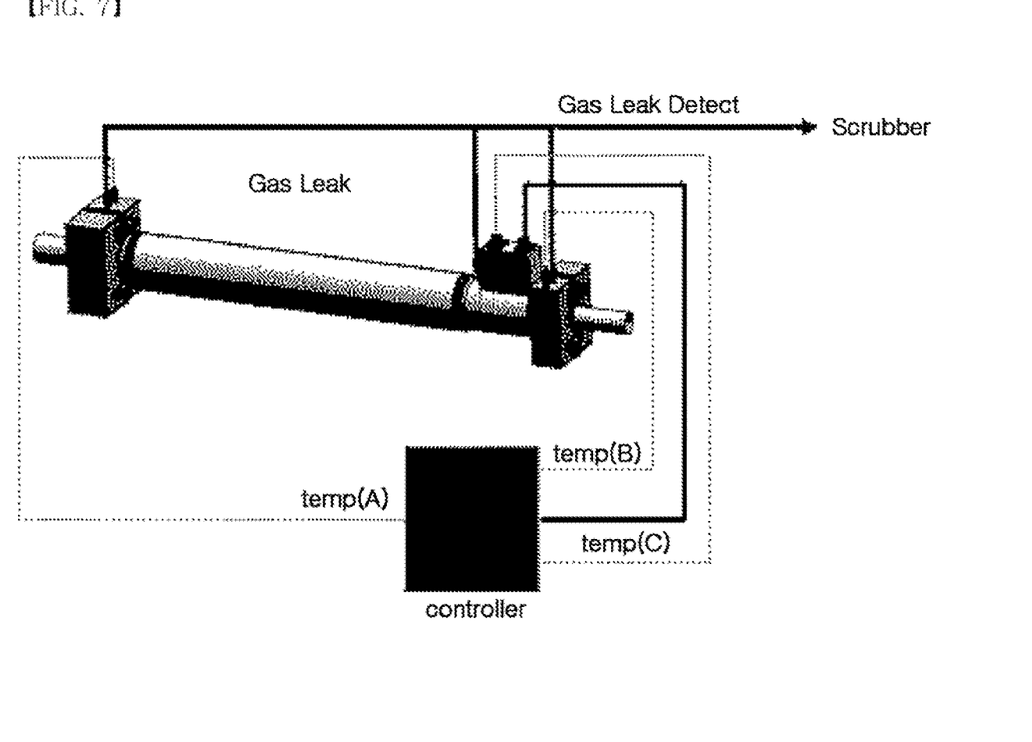
FIG. 7 is a reference view provided to explain controlling performed at a triple pipe heating device for heating an exhaust gas according to an embodiment of the present disclosure.

FIG. 1 is a perspective view showing a triple pipe heating device for heating an exhaust gas according to an embodiment of the present disclosure, FIG. 2 is a cross-sectional view showing a triple pipe heating device for heating an exhaust gas according to an embodiment of the present disclosure, FIG. 3 is an enlarged view of an encircled portion A of FIG. 2, FIG. 4 is an enlarged view of an encircled portion B of FIG. 2, FIG. 5 is a partial cutaway view showing a triple pipe heating device for heating an exhaust gas according to an embodiment of the present disclosure, FIG. 6 is a perspective view showing a triple pipe heating device for heating an exhaust gas according to an embodiment of the present disclosure, and FIG. 7 is a reference view provided to explain controlling performed at a triple pipe heating device for heating an exhaust gas according to an embodiment of the present disclosure.

As shown, a triple pipe heating device for heating an exhaust gas according to an embodiment of the present disclosure includes, as main components, a connection pipe 110, an inner bellows pipe 120, an outer bellows pipe 130, a heating member 140 for heating an exhaust gas, a sensor module 150, and a plug module 160, and among these, the connection pipe 110, the inner bellows pipe 120 and the outer bellows pipe 130 form a triple pipe structure to maximize the warming effect, and are expandable and bendable so as to be easily installed even in limited environments.

With this structure, the triple pipe heating device for heating an exhaust gas according to an embodiment of the present disclosure is easy to install, is capable of effectively heating the exhaust gas with only a small amount of heat, and also is quickly detect exhaust gas leakage and overheating to deal with the same.

Hereinafter, the triple pipe heating device for heating an exhaust gas according to an embodiment of the present disclosure will be described in more detail with reference to the respective components.

The connection pipe 110 is connected between the vacuum pump and the scrubber to circulate the exhaust gas inside. As shown in FIG. 2, the connection pipe 110 is formed of a plurality of short pipes 111 in an annular shape that are continuously connected to each other, so as to allow a body portion thereof to be expandable and bendable except for certain parts of both ends thereof. It is to be noted that, rather than using a bellows pipe like the inner bellows pipe 120 or the outer bellows pipe 130 so as to be expandable and bendable, a plurality of short pipes 111 are continuously connected to construct the body portion of the connection pipe 110. According to this configuration, there is an advantage that, unlike the bellows pipe that has a considerably uneven surface, the connection pipe 110 may have a relatively smooth surface, so that the problem of interfering with the flow of exhaust gas can be minimized.

The inner bellows pipe 120 is provided to closely surround an outer circumferential surface of the connection pipe 110 except for both ends of the connection pipe 110 and is provided as a corrugated bellows pipe that is often called a "corrugated pipe". The inner bellows pipe 120 serves to uniformly convey the heat generated from the heating member 140 to the connection pipe 110 while primarily keeping the connection pipe 110 warm. The inner bellows pipe 120 is in almost tight contact with the outer circumferential surface of the connecting pipe 110, while defining certain inner spaces between its own corrugations and the connecting pipe 110, which help to uniformly convey the heat generated from the heating member 140 to the surface of the heating tube. As described above, the inner bellows pipe 120 serves to uniformly convey the heat supplied from the heating member 140 to the connection pipe 110, and keep warmth by trapping the conveyed heat. In addition, the inner bellows pipe 120 as well as the connection pipe 110 and the outer bellows pipe 130 may be expandable and bendable, thus contributing to facilitating the overall installation of the device. One thing to note about the configuration of the inner bellows pipe 120 is that the corrugations of the inner bellows pipe 120 are formed smaller than the corrugations of the outer bellows pipe 130 so as to be as close as possible to the outer circumferential surface of the connection pipe 110 and, at the same time, to be as close as possible to the heating member 140.

The outer bellows pipe 130 in conjunction with the inner bellows pipe 120 serves to keep the connection pipe 110 warm, and is configured to be expandable and bendable. To this end, the outer bellows pipe 130, which is spaced apart from the inner bellows pipe 120, surrounds the inner bellows pipe 120 to block the outside air, thus creating a warm atmosphere, and is provided with corrugated bellows pipes to be expandable and bendable together in accordance with the connection pipe 110 and the inner bellows pipe 120. Since the outer bellows pipe 130 has wide open portions at both ends thereof, it is important to block these open portions to seal (or even completely seal) the inner spaces in order to effectively keep the connection pipe 110 warm, and a first plug member 161 and a second plug member 162 included in a plug module 160 play such a role. The first plug member 161 and the second plug member 162 will be described below.

The heating member 140 is provided in close contact with the outer circumferential surface of the inner bellows pipe 120 so as to heat the connection pipe 110 through the inner bellows pipe 120. To this end, the heating member 140 has a predetermined width and is formed in a long, flat strip shape, and is spirally wound around the outer circumferential surface of the inner bellows pipe 120. At this time, in order to ensure flexibility, the heating member 140 are wound with side ends thereof being spaced apart and not overlapped with each other, which prevents interference during expansion and bending of the inner bellows pipe 120.

As shown in FIG. 5, the heating member 140 includes a heating wire 141 that receives electricity and generate heat, a lower layer portion 142 that is formed by molding and contains the heating wire 141 therein, in which a lower surface of the lower layer portion 142 is in contact with the inner bellows pipe 120 such that the heat generated from the heating wire 141 is efficiently emitted toward the inner bellows pipe 120, an upper layer portion 144 that is formed by molding in an inverted U-shape surrounding upper and side surfaces of the lower layer portion 142 to block the heat generated from the heating wire 141 from being emitted to regions other than the lower surface of the lower layer portion 142, and an intermediate layer portion formed at an intermediate interface between the lower layer portion 142 and the upper layer portion 144 to block heat exchange between the lower layer portion 142 and the upper layer portion 144, and, in addition to the upper layer 144, secondly block the heat generated from the heating wire 141 from being emitted to regions other than the lower surface of the lower layer portion 142.

In order to facilitate the heat emission, the lower layer portion 142 is formed of a mixture of a polypropylene resin and, as a thermally conductive material, fine carbon particles in an amount of 20 to 30 wt % relative to the polypropylene resin. In order to block the heat, the upper layer portion 144 is formed of a mixture of a polypropylene resin and, as a heat blocking material, fine aluminum hydroxide particles in an amount of 50 to 60 wt % relative to the polypropylene resin. The intermediate layer portion 143 is formed of fumed silica particles that are recently receiving increasing attention as an effective heat blocking material, and the fumed silica particles form the intermediate layer portion 143 while being impregnated on flame retardant ceramic fiber.

According to the configuration of the heating member 140 as described above, the heat generated from the heating wire 141 is guided toward the direction at which the connection pipe 110 is located, while the heat is prevented from being emitted to the outside in the opposite direction, and as a result, heat loss is minimized.

The plug module 160 includes a first plug member 161 and a second plug member 162, a first temperature sensor 164, a bimetal 165, and a block cover 166.

The first plug member 161 and the second plug member 162 of the plug module 160 are provided to surround, while being spaced apart from, the outer circumferential surface of the front end and the outer circumferential surface of the rear end of the connection pipe 110, which are not surrounded by the inner bellows pipe 120, to thus define inner spaces, and sealingly close the front and rear ends of the outer bellows pipe 130 that are open. The front end of the outer bellows pipe 130 and the first plug member 161, and the rear end of the outer bellows pipe 130 and the second plug member 162 are provided with flanges 131a, 161a, 131b, and 162a, respectively, and flange-coupled, and the coupling between respective flanges is simply achieved with a plurality of claw type clamps 132.

Meanwhile, a first temperature sensor 164 is provided on an outer circumferential surface of the first plug member 161 to measure the surface temperature thereof. The first temperature sensor 164 measures the surface temperature of the first plug member 161 which is formed by receiving the heat in the inner spaces of the outer bellows pipe 130 that are sealingly closed by the first plug member 161 and the second plug member 162, and the heat from the front end of the connection pipe 110 to which the first plug member 161 is directly coupled. When the first temperature sensor 164 measures the surface temperature of the first plug member 161 as described above, the controller (not shown) may control the temperature of the heating wire 141 based on the measured temperature to maintain an appropriate temperature. In addition, a power and sensor port 164 and a bimetal 165 are provided on an outer side of the first plug module 160, and a block cover 166 is also provided to cover them from exposure to the outside.

Sensor modules 150 are provided at connection portions of the front and rear ends of the connection pipe 110, respectively, and serve to detect abnormality of the heating wire 141 and exhaust gas leaks. To this end, the sensor modules 150 include sealing boxes 151, each of which sealingly surrounds a connection portion between a front end of the short connection pipe 167 connected to the front end of the connection pipe 110 and a scrubber-side pipe P2, and a connection portion between the rear end of the connection pipe 110 and the vacuum pump-side pipe P1, while defining therein a small-scale space for measuring temperature. The sealing boxes 151 have such a configuration in which halved bodies, i.e., half bodies 151a and 151b are coupled from left and right sides, which contribute to improving the assemblability of the device. Each of the sealing boxes 151 is provided with a second temperature sensor 154 for measuring temperature of the inner space. As a result, the controller may determine abnormality of the heating wire 141 and the exhaust gas leakage based on the temperature of the inner space of the sealing box 151 measured by the second temperature sensor 154. Note that, as shown in FIG. 6, the short connection pipe 167 is a short pipe that is connected to the front end of the connection pipe 110 via a through hole 161b interposed therebetween, in which the through hole 161b is formed in the front end of the first plug member 161. Meanwhile, an inner flange 161b is provided on an inner surface of the front end of the first plug member 161 and flange-coupled to a flange 112a provided on the front end of the connection pipe 110.

In the configuration of the sensor module 150 described above, since the sealing boxes 151 are provided to sealingly surround the connection portion between the front end of the short connection pipe 167 and the scrubber-side pipe P2, and the connection portion between the rear end of the connection pipe 110 and the vacuum pump-side pipe P1, respectively, even when only a small amount of exhaust gas is leaked through the connection portions, the second temperature sensor 154 may quickly detect the temperature change, so that the controller may more quickly generate an alarm and if necessary, stop the operation of the device.

Meanwhile, gas leak ports 153 and 163 for guiding the exhaust gas leak to the scrubber are provided on the sealing box 151 and the first plug member 161 provided on a front end connection part of the short connection pipe 167 and a rear end connection part of the connection pipe 110, respectively. As shown in FIG. 7, these gas leak ports are joined into a single pipe directed to the scrubber to safely guide all of the exhaust gas to the scrubber even when the amount of leakage of the exhaust gas is not large.

In addition, the rear end of the connection pipe 110 and the vacuum pump-side pipe P1, and the front end of the short connection pipe 167 and the scrubber-side pipe P2 are flange-coupled, respectively, and each flange-coupling is achieved with a ring-shaped clamp 156. The front end of the outer bellows pipe 130 and the first plug member 161, and the rear end of the outer bellows pipe 130 and the second plug member 162 are flange-coupled, respectively, and each flange-coupling is achieved with a plurality of claw type clamps 132. From this configuration, it can be seen that the present disclosure is configured with triple pipes which can be a relatively complicated configuration, but can be simply assembled and disassembled and also can be simply connected between existing pipes.

Although preferred embodiments of the present disclosure have been described above, the present disclosure may use various changes, modifications, and equivalents. It is clear that the present disclosure may be applied in the same manner by appropriately modifying the embodiments described above. Accordingly, the description described above does not limit the scope of the disclosure as defined by the limitations of the following claims.

What is claimed is:

1. A triple pipe heating device for heating an exhaust gas, wherein the triple pipe heating device is a heating device that prevents solidification of the exhaust gas by heating the exhaust gas conveyed between a vacuum pump and a scrubber in semiconductor and LCD manufacturing process, and the triple pipe heating device comprises:

a connection pipe connected between the vacuum pump and the scrubber to circulate the exhaust gas to inside, and configured of a plurality of short pipes having an annular shape continuously connected to each other to allow a body of the connection pipe to be expandable and bendable except for both end portions thereof;

an inner bellows pipe provided to closely surround an outer circumferential surface of the connection pipe except for both ends of the connection pipe, and expandable and bendable in conjunction with the connection pipe;

a heating member provided in close contact with an outer circumferential surface of the inner bellows pipe so as to heat the connection pipe through the inner bellows pipe; and an outer bellows pipe provided to surround the inner bellows pipe while being spaced apart from the inner bellows pipe to define a space so as to block outside air and create a warm atmosphere, and expandable and bendable in accordance with the connection pipe and the inner bellows pipe, wherein the heating member has a predetermined width and is formed in a long, flat strip shape to be spirally wound around the outer circumferential surface of the inner bellows pipe, with side ends of the heating member being spaced apart and not overlapped with each other so as not to interfere with each other during expansion and bending of the inner bellows pipe, wherein the heating member comprises:

a heating wire that receives electricity and generates heat;

a lower layer portion that is formed by molding and contains the heating wire therein, with a lower surface of the lower layer portion being in contact with the inner bellows pipe, and is formed of a mixture of a polypropylene resin and fine carbon particles in an amount of 20 to 30 wt % relative to the polypropylene resin so as to smoothly emit heat generated from the heating wire;

an upper layer portion that is formed by molding in an inverted U-shape to surround upper and side surfaces of the lower layer portion, and is formed of a mixture of a polypropylene resin and fine aluminum hydroxide particles in an amount of 50 to 60 wt % relative to the polypropylene resin so as to block heat generated from the heating wire from being emitted to regions other than a lower surface of the lower layer portion; and an intermediate layer portion that is formed of fine fumed silica particles at an intermediate interface between the lower layer portion and the upper layer portion so as to, in addition to the upper layer, secondly block the heat generated from the heating wire from being emitted to regions other than the lower surface of the lower layer portion, whereby the heat generated from the heating wire is guided toward the connection pipe through the inner bellows pipe.

2. The triple pipe heating device of claim 1, wherein the inner bellows pipe is provided with a corrugation smaller than the outer bellows pipe so as to be in close contact with the outer circumferential surface of the connection pipe.

3. A triple pipe heating device for heating an exhaust gas, wherein the triple pipe heating device is a heating device that prevents solidification of the exhaust gas by heating the exhaust gas conveyed between a vacuum pump and a scrubber in semiconductor and LCD manufacturing process, and the triple pipe heating device comprises:

a connection pipe connected between the vacuum pump and the scrubber to circulate the exhaust gas to inside, and configured of a plurality of short pipes having an annular shape continuously connected to each other to allow a body of the connection pipe to be expandable and bendable except for both end portions thereof;

an inner bellows pipe provided to closely surround an outer circumferential surface of the connection pipe except for both ends of the connection pipe, and expandable and bendable in conjunction with the connection pipe;

a heating member provided in close contact with an outer circumferential surface of the inner bellows pipe so as to heat the connection pipe through the inner bellows pipe;

an outer bellows pipe provided to surround the inner bellows pipe while being spaced apart from the inner bellows pipe to define a space so as to block outside air and create a warm atmosphere, and expandable and bendable in accordance with the connection pipe and the inner bellows pipe, wherein the heating member has a predetermined width and is formed in a long, flat strip shape to be spirally wound around the outer circumferential surface of the inner bellows pipe, with side ends of the heating member being spaced apart and not overlapped with each other so as not to interfere with each other during expansion and bending of the inner bellows pipe;

a first plug member and a second plug member provided to surround, while being spaced apart from, an outer circumferential surface of a front end of the connection pipe and an outer circumferential surface of a rear end of the connection pipe, which are not surrounded by the inner bellows pipe, so as to sealingly close the front and rear ends of the outer bellows pipe that are open;

a first temperature sensor provided inside the first plug member that seals the front end of the outer bellows pipe, to measure a temperature of a sealed inner space of the outer bellows pipe; and a controller that controls the heating wire based on the temperature measured by the first temperature sensor to maintain a proper temperature.

4. The triple pipe heating device of claim 3, further comprising:

a short connection pipe passed through the first plug member to be connected to the front end of the connection pipe;

sealing boxes that sealingly surround a connection portion between a front end of the short connection pipe and a scrubber-side pipe, and a connection portion between a rear end of the connection pipe and a vacuum pump-side pipe, respectively, while defining therein small-scale spaces for measuring temperature, wherein the sealing box is formed as half bodies are coupled from left and right sides; and a second temperature sensor for measuring temperature of the inner space of each sealing box, whereby the controller determines abnormality of the heating wire and exhaust gas leakage based on the temperature of the inner spaces of the sealing boxes measured by the second temperature sensor.

5. The triple pipe heating device of claim 4, comprising a gas leak port provided on the sealing boxes and the first plug member, which are provided at the connection portion of the front end of the short connection pipe and at the connection portion of the rear end of the connection pipe, respectively, to guide exhaust gas leak to the scrubber, wherein the rear end of the connection pipe and the vacuum pump-side pipe, and the front end of the short connection pipe and the scrubber-side pipe are flange-coupled, respectively, and each flange-coupling is achieved with a ring-shaped clamp, and the front end of the outer bellows pipe and the first plug member, and the rear end of the outer bellows pipe and the second plug member are flange-coupled, respectively, and each flange-coupling is achieved with a plurality of claw clamps.

\* \* \* \* \*